US006549027B1

(12) United States Patent
Mott

(10) Patent No.: US 6,549,027 B1
(45) Date of Patent: Apr. 15, 2003

(54) APPARATUS AND METHOD FOR TESTING FOR COMPATIBILITY BETWEEN CIRCUIT BOARDS

(75) Inventor: James A. Mott, Oakland, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 42 days.

(21) Appl. No.: 09/707,665

(22) Filed: Nov. 7, 2000

Related U.S. Application Data

(60) Provisional application No. 60/179,594, filed on Feb. 1, 2000.

(51) Int. Cl.[7] .................................................. G01R 1/04
(52) U.S. Cl. ..................................... 324/764; 324/158.1
(58) Field of Search ................................ 324/761, 759, 324/764, 763; 714/733, 734, 781; 710/8, 10, 62, 100; 713/100

(56) References Cited

U.S. PATENT DOCUMENTS

| | | | |
|---|---|---|---|
| 4,659,155 A | | 4/1987 | Walkup et al. |
| 4,674,812 A | | 6/1987 | Thom et al. |
| 4,686,607 A | | 8/1987 | Johnson |
| 4,876,630 A | | 10/1989 | Dara |
| 4,892,376 A | | 1/1990 | Whitehouse |
| 4,947,288 A | | 8/1990 | Olsson et al. |
| 5,018,146 A | * | 5/1991 | Sexton ........................ 714/781 |
| 5,023,754 A | | 6/1991 | Aug et al. |
| 5,182,780 A | | 1/1993 | Robertson |
| 5,352,123 A | | 10/1994 | Sampel et al. |
| 5,491,830 A | * | 2/1996 | Ferri ............................ 710/10 |
| 5,537,052 A | * | 7/1996 | Wilson et al. ............... 324/763 |
| 5,666,557 A | * | 9/1997 | Cassidy et al. ................. 710/8 |
| 5,715,422 A | * | 2/1998 | Perkins ........................ 710/301 |
| 5,790,890 A | * | 8/1998 | Mirov et al. .................. 710/15 |
| 6,216,186 B1 | * | 4/2001 | Mayhead et al. ........... 710/301 |

OTHER PUBLICATIONS

Richard Grigonis, "Now Boarding: Ethernet Rides the CompactPCI MidPlane," Computer Telephony, OCt. 5, 2000, 4 pages, printed from http://www.cconvergence.com/article/printableArticle?doc_idxCTM20001001S0003.

* cited by examiner

Primary Examiner—Vinh P. Nguyen
(74) Attorney, Agent, or Firm—Park, Vaughan & Fleming, LLP

(57) ABSTRACT

An apparatus and method for comparing identifications of circuit boards in a midplane. When a first circuit board and a second circuit board are inserted into opposite sides of the midplane, an incompatibility between the first circuit board and the second circuit board may damage or impair the operation of one or both of the first circuit board and the second circuit board. To solve this problem, a first identification is stored on the first circuit board and a second identification is stored on the second circuit board. If the first identification of the first circuit board and the second identification of the second circuit board indicate an incompatibility, then one or both of the first circuit board and the second circuit board is/are prevented from fully powering up.

30 Claims, 7 Drawing Sheets

APPARATUS AND METHOD FOR TESTING FOR COMPATIBILITY BETWEEN CIRCUIT BOARDS

This application claims priority to a U.S. provisional application having a Ser. No. 60/179,594 and a Feb. 1, 2000 filing date.

FIELD

The invention relates generally to computer systems including field replaceable units, and in particular to an apparatus and method for testing compatibility between multiple boards inserted into a backplane, such as a front board and a rear board inserted into a midplane.

BACKGROUND

Distributed computing systems (or computer networks) are generally known. Computer networks typically comprise a plurality of personal computers, or workstations, or network appliances and other data processing devices connected together for information exchange. At the heart of the computer network is one or more network servers, hereafter generally referred to as "servers." In most computer networks, network servers are responsible for managing the network, running applications, and administering documents or data generated at the attached data processing devices.

Network interface controller (NIC) cards commonly are used to couple the server to one or more computer networks. Both the SCSI hard disk and network interface controller connect to slots or connectors in the network server system board in a space designed and designated to accommodate their size and operational requirements. A server system board includes connectors for receiving external cards, such as the NIC cards. Other expansion slots may be provided on the server system board such as Peripheral Component Interconnect (PCI) and Compact PCI expansion slots for receiving peripheral devices designed for those particular bus standards.

In electronic enclosures for servers that include a midplane design, signals can be communicated through a backplane between different boards, such as through a midplane between a front board and a rear board. Incompatibility between the front board and the rear board may cause unpredictable behavior or even damage to one or both boards. Compounding this problem, spatially keeping track of the front board with respect to the rear board can be problematic. Systems including a midplane design may be incorporated within closely positioned racks of systems. Thus, correctly inserting matching front and rear boards may depend on accurately counting card slots and system racks in one corridor, walking around to the other side, and then accurately counting racks and slots on the other side. A simple counting mistake can result in an incorrect board insertion, potentially causing faulty operation, board failure, or downtime of a computer. A solution to this problem should prevent damage to the front board if the rear board fails to match the front board, and/or prevent damage to the rear board if the front board fails to match the rear board.

SUMMARY

To overcome the limitations described above, and to overcome other limitations that will become apparent upon reading and understanding the present specification, disclosed is an apparatus and method for checking compatibility of circuit boards inserted into a midplane of a computer.

In one embodiment, a first circuit board and a second circuit board respectively store a first identification and a second identification. The first identification and the second identification may be required to be identical, or different. Each identification may be stored in a memory on the respective circuit board. The first identification is sent from the first circuit board to the second circuit board. At the second circuit board, the first identification is received and compared to the second identification. An incompatibility can be revealed after comparing the first identification and the second identification. One response to finding such an incompatibility is to prevent one or both of the first circuit board and the second circuit board from fully powering up, thus avoiding damaging interaction.

A computer system includes an embodiment with one or more circuit boards and memory storing one or more identifications of the circuit board(s).

DETAILED DESCRIPTION

This invention is described in a preferred embodiment in the following description with reference to the Figures, in which like numbers represent the same or similar elements. While this invention is described in terms of the best mode for achieving this invention's objectives, it will be appreciated by those skilled in the art that variations may be accomplished in view of those teachings without deviating from the spirit or scope of the invention.

Figure 1:
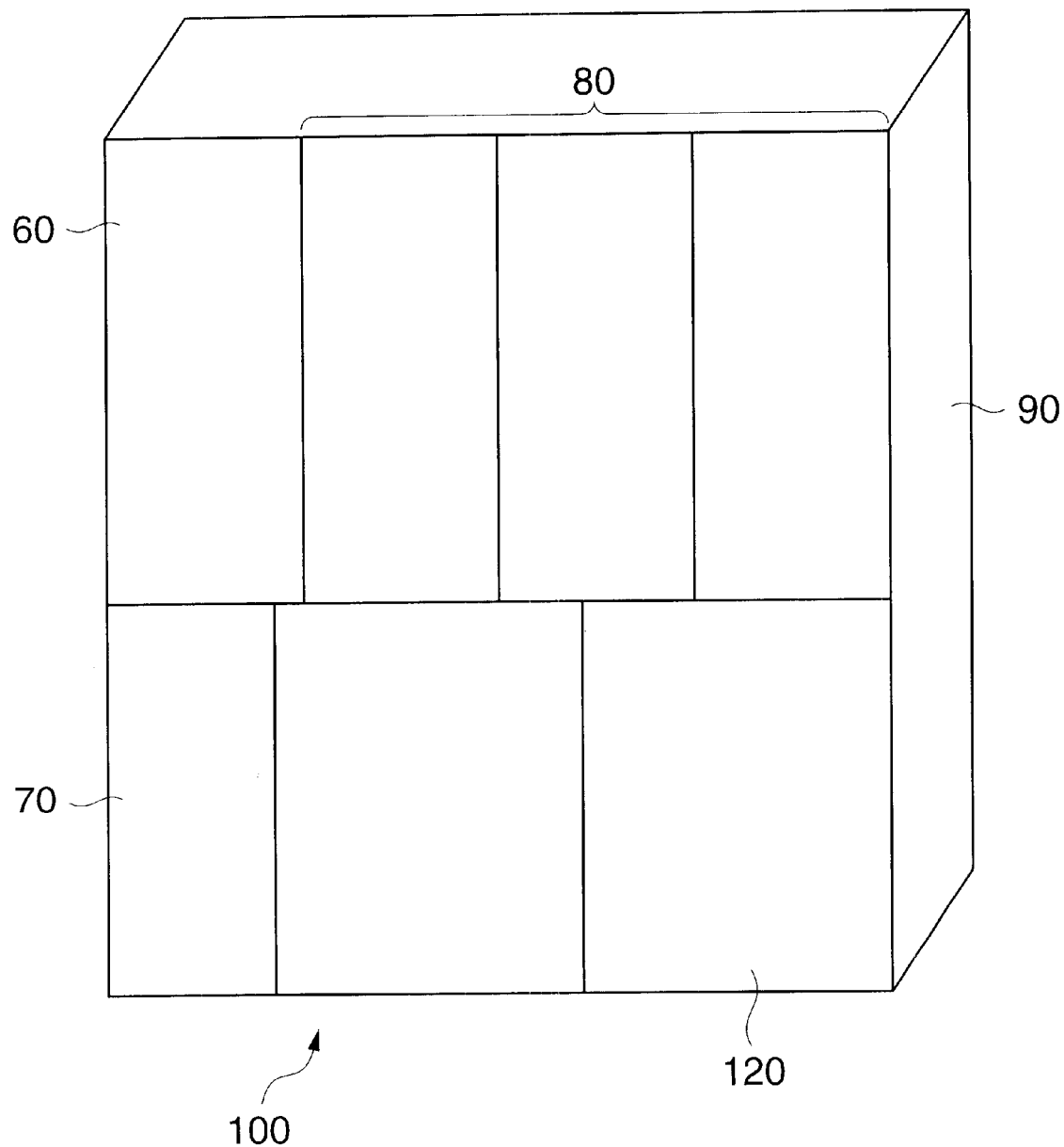
FIG. 1 is a diagram of a computer system.

One example of a computer system embodiment is shown in FIG. 1. This embodiment shows a server 100 with a computer chassis 90 providing support for a central processing unit 60, a power supply 70, expansion card spaces 80, and a device bay 120.

Figure 2:
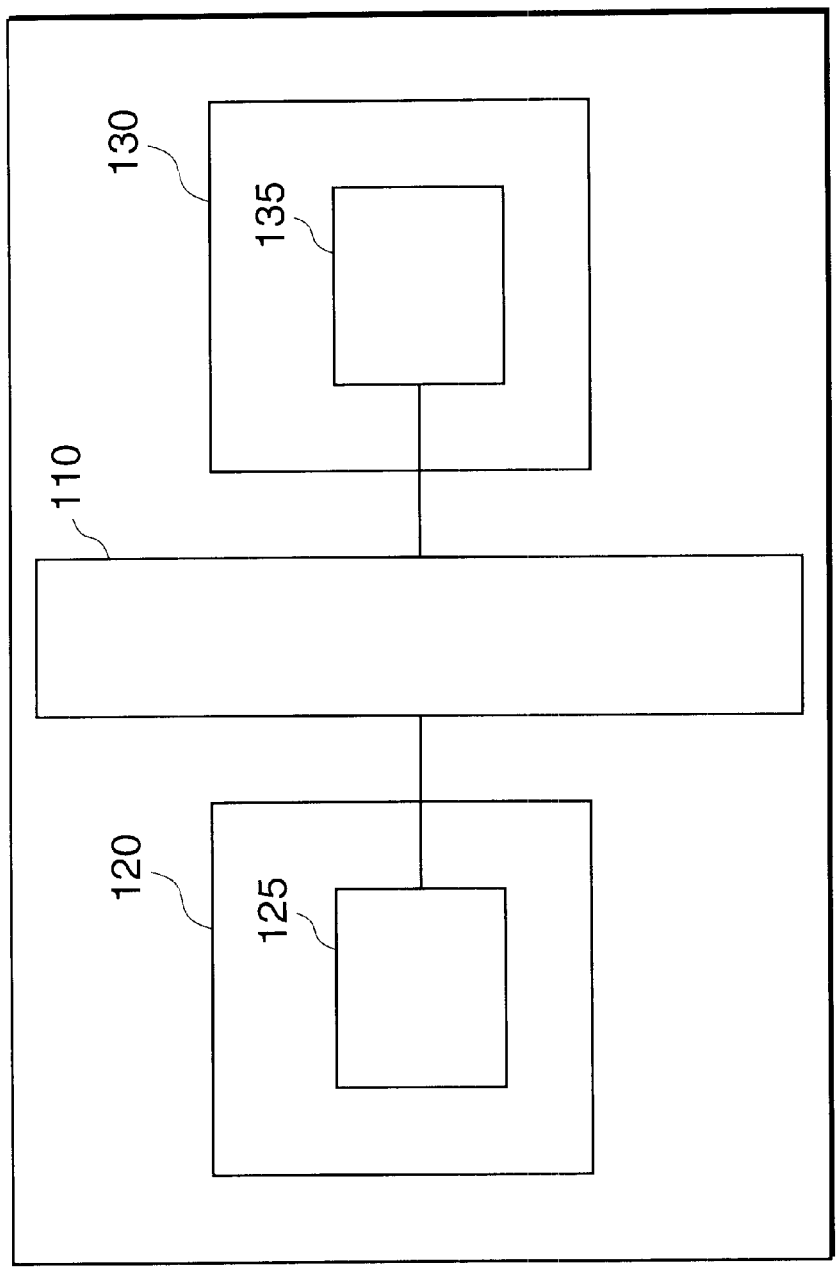
FIG. 2 is a block diagram of the computer system including circuit boards with identification circuitry.

FIG. 2 shows a computer 100 which includes a midplane 110. A first circuit board 120 and a second circuit board 130 are coupled to the midplane 110. The first circuit board 120 and/or the second circuit board 130 maybe coupled through the midplane 110. The term midplanes includes backplanes and motherboards. In one embodiment, the first circuit board 120 and the second circuit board 130 are coupled to opposite sides of the midplane 110, and one or more pins of the first circuit board 120 and the second circuit board 130 couple together, electrically, physically, or otherwise. The first circuit board 120 includes a first identification circuit 125. The first identification circuit 125 stores a first identification corresponding to the first circuit board 120. The second circuit board 130 includes a second identification circuit 135. The second identification circuit 135 stores a second identification corresponding to the second circuit board 120. The second identification and the first identification may be identical in some embodiments and different in other embodiments. In other embodiments, the first circuit board 120 and the second circuit board 130 may not be in directly opposite positions of the midplane 110, but spaced apart. In other embodiments, the first circuit board 120 and the second circuit board 130 may be on the same side of the midplane 110, or on different midplanes.

An identification of a circuit board includes data, such as multiple bits, for identifying the circuit board. The identification of a circuit board may convey information about the physical and/or software requirements of the circuit board. In one embodiment, the identification conveys not only a type of the circuit board, but also a version of the type of the circuit board. One embodiment includes first and second circuit boards which include physically compatible connectors, such as having common connector styles, but are electrically incompatible with each other.

In another embodiment, the identification of the circuit board is compared with information stored in a memory coupled to the midplane. The memory may store information pertinent to the identification of the circuit board, or a registry of many identifications of many circuit boards. The registry can include information on incompatibilities between different circuit boards or different versions of circuit boards. The identification of the circuit board may provide compatibility information between the circuit board and a non-circuit board computer component. If the circuit board is incompatible, the circuit board will fail to operate correctly in the midplane, such as by not being enabled. One or more circuit boards may be checked for compatibility.

Figure 3:
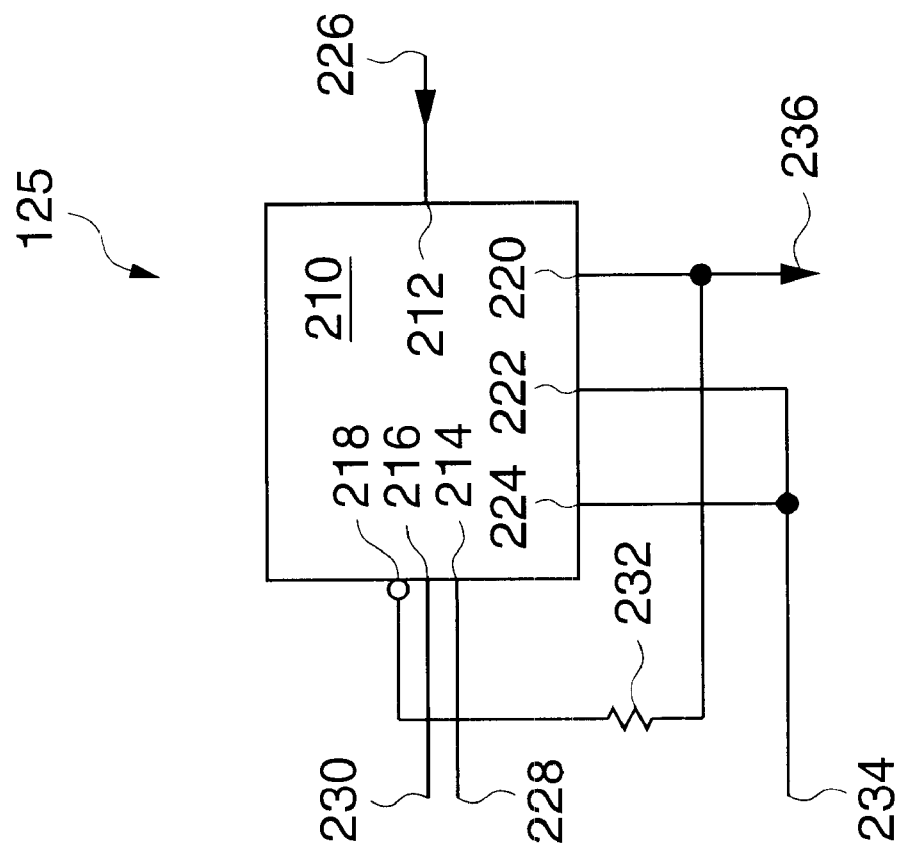
FIG. 3 is a schematic of identification circuitry on a first circuit board 120 shown in FIG. 2.

FIG. 3 shows an electrical schematic of the first identification circuit 125 on the first circuit board 120. The first identification circuit 125 includes a serial ROM 210 storing the first identification. The serial ROM 210 includes a DATA pin 212, a CLK pin 214, a RESET pin 216, a CE pin 218, a GND pin 220, a VPP pin 222, and a V3 pin 224. The DATA pin 212 is coupled to a DATA line 226. The CLK pin 214 is coupled to a first CLK line 228. The RESET pin 216 is coupled to a RESET line 230. The CE pin 218 is coupled to the GND pin 220 with a resistor 232. The V3 pin 224 and the VPP pin 222 are coupled to an early power line 234. The GND pin 220 is coupled to a GND line 236. Early power can be power applied to a limited portion of circuitry prior to applying power to a substantial portion of the circuitry.

Figure 4:
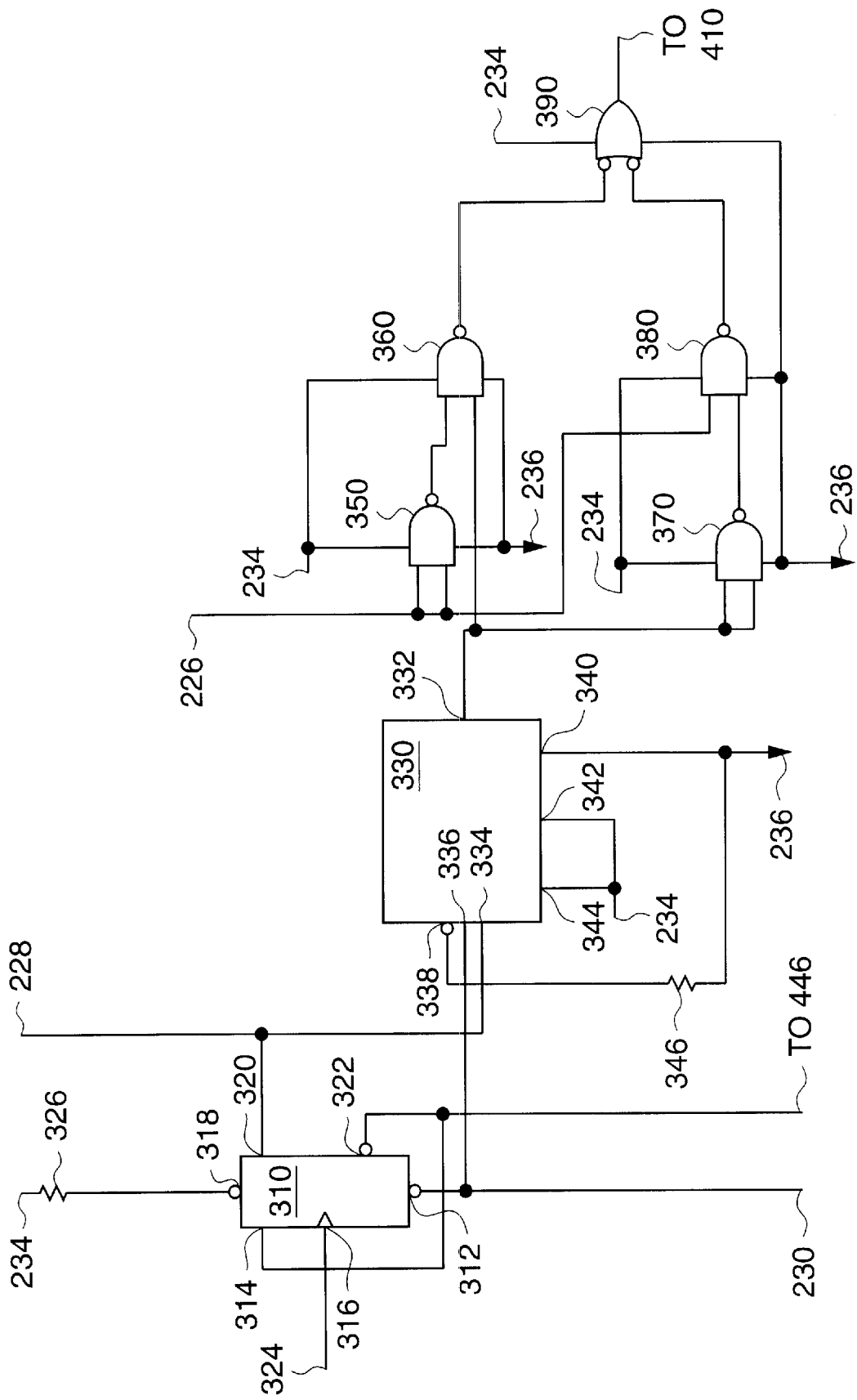
FIG. 4 is a schematic of a first part of more identification circuitry on a second circuit board 130 shown in FIG. 2.

FIG. 4 shows an electrical schematic of a first part of the second identification circuit 135 on the second circuit board 130. The first part of the second identification circuit 135 includes a flip flop 310; a serial ROM 330 storing the second identification; NAND gates 350, 360, 370, and 380; and a gate 390.

The flip flop 310 includes a reset pin 312, a D pin 314, an edge-triggered clock pin 316, a power pin 318, a Q pin 320, and a complemented Q pin 322. The reset pin 312 is coupled to the RESET line 230. The D pin 314 is coupled to the complemented Q pin 322. The clock pin 316 is coupled to a second clock line 324. The power pin 318 is coupled to the early power line 234 with a resistor.326. The Q pin 320 is coupled to the first CLK line 228.

The serial ROM 330 includes a DATA pin 332, a CLK pin 334, a RESET pin 336, a CE pin 338, a GND pin 340, a VPP pin 342, and a V3 pin 344. The CLK pin 334 is coupled to the Q pin 320 of the flip flop 310. The RESET pin 336 is coupled to the RESET line 230. The CE pin 338 is coupled to the GND pin 340 with a resistor 346. The GND pin 340 is coupled to the GND line 236. The VPP pin and the V3 pin are coupled to the early power line 234.

Gates 350, 360, 370, 380, and 390 include a VCC pin coupled to the early power line 234 and a GND pin coupled to the GND line 236. Both inputs of the NAND gate 350 are coupled to the DATA line 226. Both inputs of the NAND gate 370 are coupled to the DATA pin 332 of the serial ROM 330. The NAND gate 360 has a first input coupled to an output of the NAND gate 350 and a second input coupled to the DATA pin 332 of the serial ROM 330. Both inputs of the NAND gate 370 are coupled to the DATA line 226 coupled to the serial ROM 210. The NAND gate 380 has a first input coupled to an output of the NAND gate 370 and a second input coupled to the DATA line 226 coupled to the serial ROM 210. The gate 390 is an OR gate having complemented inputs. The gate 390 has a first input coupled to an output of the NAND gate 360 and a second input coupled to an output of the NAND gate 380.

Figure 5:
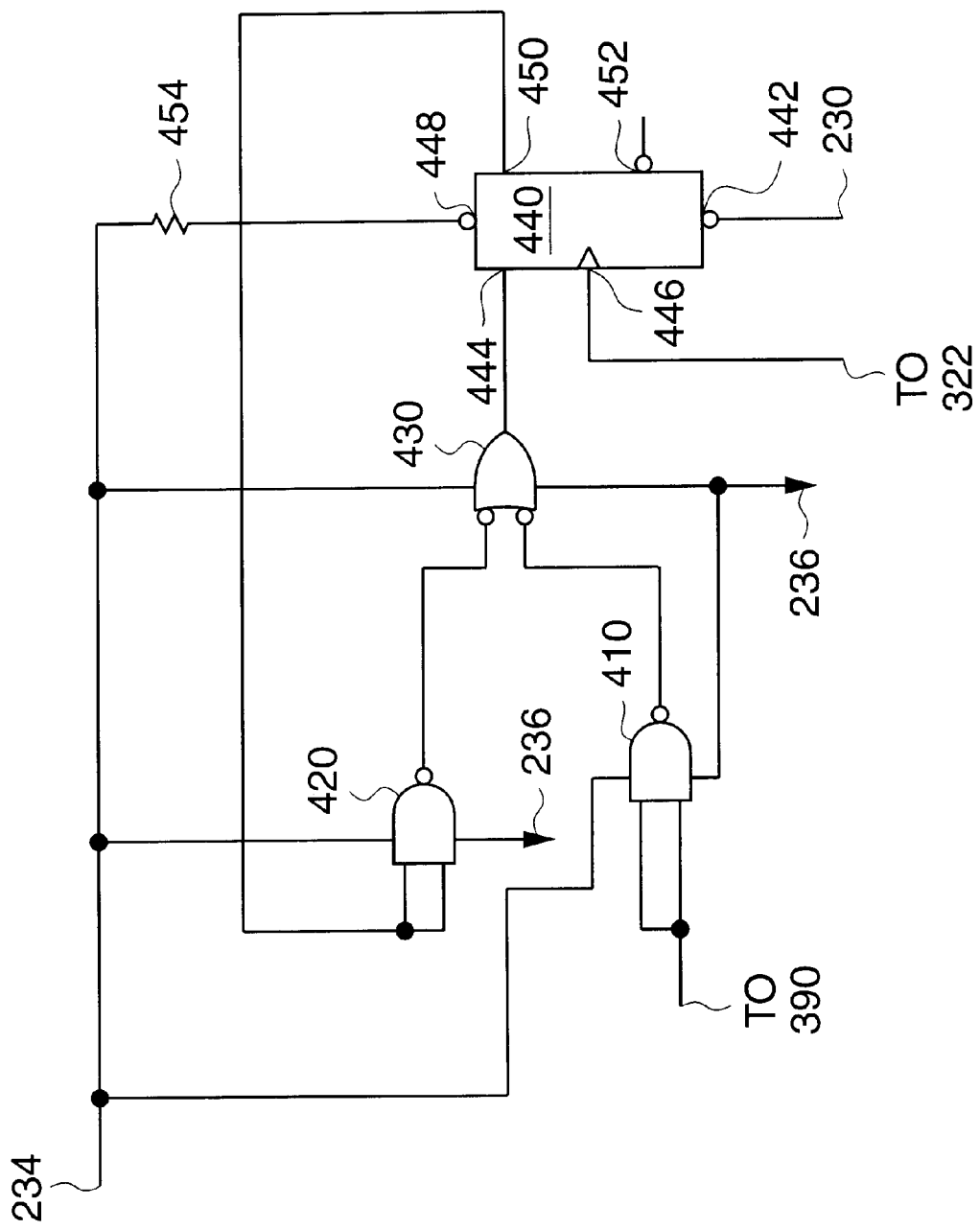
FIG. 5 is a schematic of a second part of more identification circuitry on the second circuit board 130 shown in FIG. 2.

FIG. 5 shows an electrical schematic of a second part of the second identification circuit 135 on the second circuit board 130. The second part of the second identification circuit 135 includes NAND gates 410 and 420, a gate 430, and a flip flop 440. The gates 410, 420, and 430 include a VCC pin coupled to the early power line 234 and a GND pin coupled to the GND line 236. Both inputs of the NAND gate 410 are coupled to an output of the gate 390. The gate 430 is an OR gate having complemented inputs. The gate 430 has a first input coupled to an output of the NAND gate 410 and second input coupled to an output of the NAND gate 420.

The flip flop 440 includes a reset pin 442, a D pin 444, an edge-triggered clock pin 446, a power pin 448, a Q pin 450, and a complemented Q pin 452. The reset pin 442 is coupled to the RESET line 230. The D pin 444 is coupled to an output of the gate 430. The clock pin 446 is coupled to the complemented Q pin 322 of the flip flop 310. The power pin 448 is coupled to the early power line 234 with a resistor 454. The Q pin 450 is coupled to both inputs of the NAND gate 420.

One embodiment functions in the following fashion. The serial ROM 210 provides the first identification of the first circuit board 120 and the serial ROM 330 provides the second identification of the second circuit board 130. The first identification is provided from the first circuit board 120 to the second circuit board 130. The second circuit board 130 receives the first identification, and the identifications are compared as follows. The gates 350, 360, 370, 380, and 390 perform a logical XOR function with bits of the first identification and the second identification. If bits of the first identification and second identification agree, the logical XOR function yields a first XOR value. If bits of the first identification and the second identification disagree, the logical XOR function yields a second XOR value.

The gates 410, 420, and 430 perform a logical OR function with a result of the logical XOR function and a flip flop value stored in the flip flop 440. The flip flop value stored in the flip flop 440 begins as a first flip flop value. So long as the bits of the first and second identifications compared by the XOR function agree, the OR function yields a first OR value and the flip flop 440 continues to store the first flip flop value. However, if any of the bits of the first and second identifications compared by the XOR function disagree, then the OR function yields a second OR value and the flip flop 440 stores the second flip flop value. Thus, the first flip flop value indicates a compatibility between the first circuit board 120 and the second circuit board 130, and the second flip flop value indicates an incompatibility between the first circuit board 120 and the second circuit board 130.

In one embodiment, XOR and OR logical functions are performed to compare identifications. In other embodiments, different combinations of logical functions and/or different logical functions compare identifications. For example, gates performing an XOR function can be replaced with XOR gates.

If the first and second identifications disagree, then one or both of the first circuit board 120 and the second circuit board 130 can be prevented from fully powering up. The early power line 234 can be coupled to longer pins of the first circuit board 120 and the second circuit board 130, and another power line for other portions of the circuits boards can be coupled to shorter pins. When the first circuit board 120 or the second circuit board 130 is inserted into the midplane 110, the longer pins contact the midplane 110 before the shorter pins. The first identification and/or the second identification can be checked for compatibility before allowing main power from the shorter pins to fully power up and possibly damage the first circuit board 120 or the second circuit board 130.

The serial ROMs and other parts are exemplary. One advantage of serial ROMs is an ability to hold a relatively long identification. Obviously, a longer identification can identify a wider range of circuit boards. Other components having similar overall functionality may replace the serial ROMs and other parts. In another embodiment, parallel ROMs store the identifications. Parallel ROMs may require more pins on circuit board connectors for carrying identification information. A number of circuit board connector pins required in an embodiment with parallel ROMs may be lessened, if information from the parallel ROMs is serialized prior to transferring identification information off of the circuit board. The term pin is exemplary and indicates an input to or output from a component such as a chip. The term line is exemplary and indicates a medium coupling together multiple components.

Figure 6:
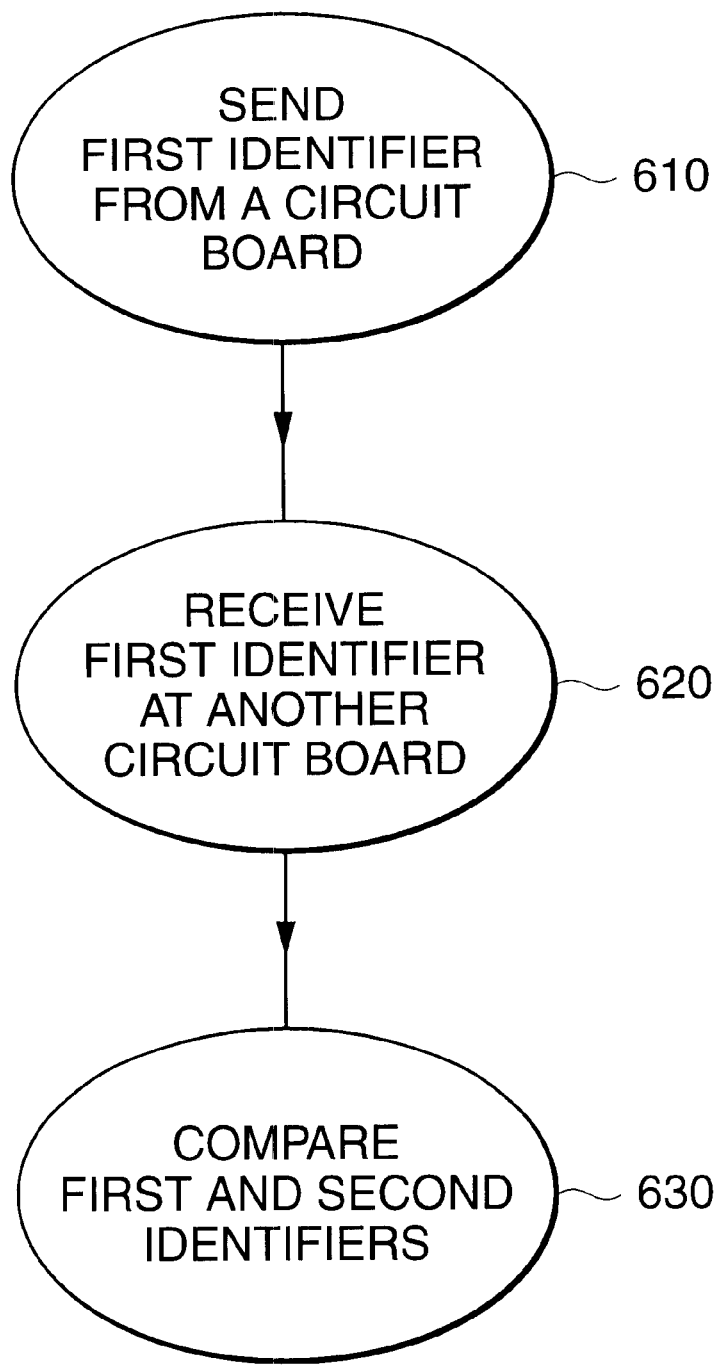
FIG. 6 is a flow diagram of a method, of comparing first and second identifiers of different circuit boards.

FIG. 6 shows an exemplary method of comparing identifiers of different circuit boards in a computer. In 610, a first identifier of a first circuit board is sent. In 620, the first identifier is received at a second circuit board. Identifiers may identify a type or version of the circuit board. Identifiers may reside on the circuit board associated with the identifier or in a separately located repository associating identifiers with circuit boards. At 630, the first identifier and the second identifier are compared. The comparison can check the compatibility of the first circuit board and/or the second circuit board in the computer and/or with each other. If an incompatibility is found, full power up may be prevented.

Figure 7:
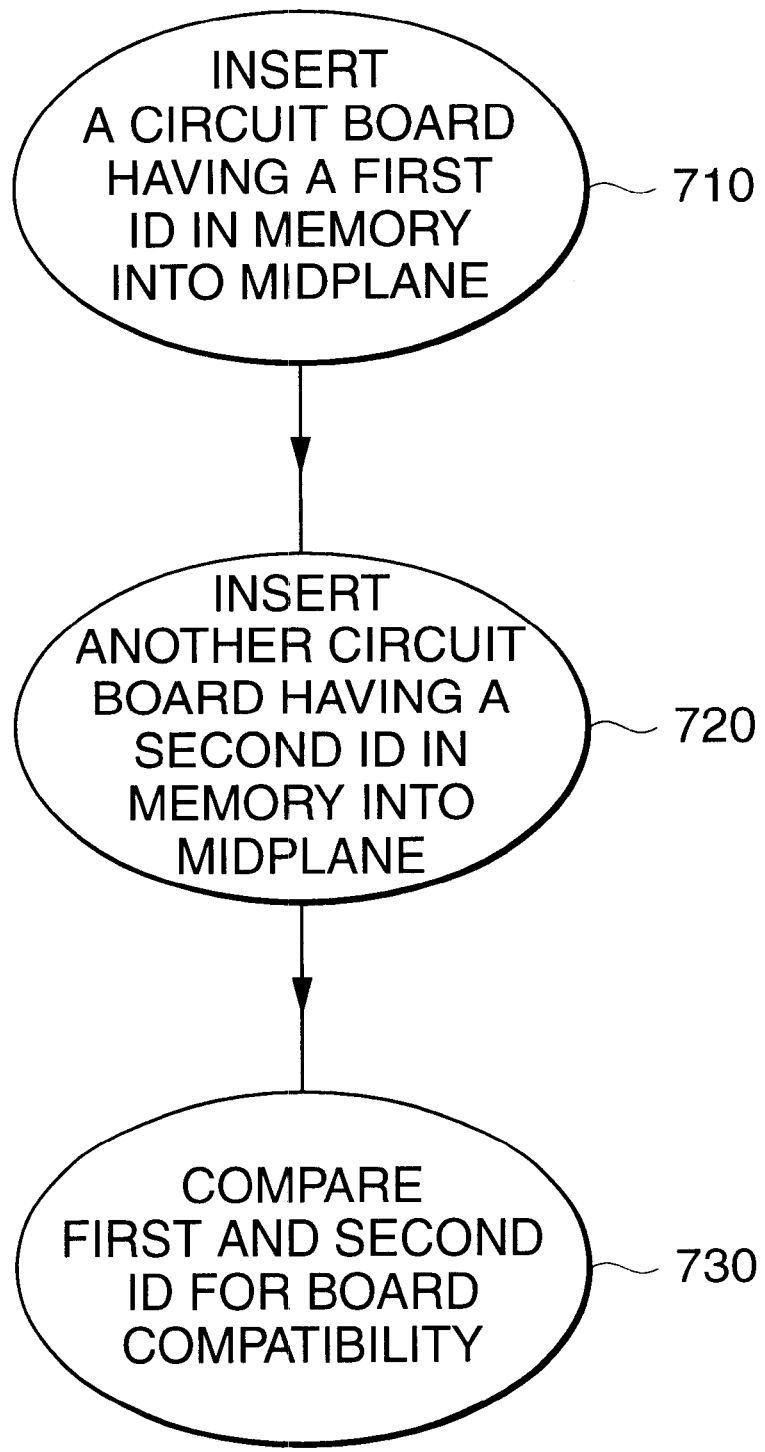
FIG. 7 is a flow diagram of another method, of comparing first and second identifications of different circuit boards.

FIG. 7 shows another exemplary method of comparing identifications of different circuit boards. In 710, a first circuit board having a first identification held in a first memory is inserted into a midplane. In 720, a second circuit board having a second identification held in a second memory is inserted into the midplane. The first circuit board and the second circuit board may be positioned on opposite or the same sides of the midplane. In 730, the first identification and the identification are compared to check compatibility between the first circuit board and the second circuit board. Checking compatibility can include checking a version of a circuit board. If an incompatibility exists, one or more circuit boards can be prevented from fully powering up.

The disclosed methods are exemplary. Parts of the methods may be modified, deleted, added to, or rearranged in order.

While the preferred embodiments of the present invention have been illustrated herein in detail, it should be apparent that modifications and adaptations to those embodiments may occur to those skilled in the art without departing from the scope of the present invention as set forth in the following claims.

What is claimed is:

1. A method of checking compatibility between first and second circuit boards coupled to a midplane of a computer, comprising:
   receiving at a second circuit board a first identifier of a first circuit board;
   retrieving from a read-only memory in the second board a second identifier of the second circuit board; and
   at the second circuit board, comparing the first identifier with the second identifier of the second circuit board to check compatibility between the first circuit board and the second circuit board.

2. The method of claim 1, wherein the second identifier identifies at least one of:
   a type of the second circuit board; and
   a version of the type of the second circuit board.

3. The method of claim 1, wherein said receiving comprises:
   receiving the first identifier from a registry of identifiers of circuit boards.

4. The method of claim 1, further comprising:
   responsive to the step of comparing, preventing one of the first circuit board and the second circuit board from fully powering up if an incompatibility is found.

5. The method of claim 1, further comprising:
   serially communicating the first identifier to the second circuit board.

6. The method of claim 5, wherein the comparing includes comparing the first identifier to the second identifier one bit at a time.

7. A method of checking compatibility of first and second circuit boards in a midplane of a computer, comprising:
   sending a first identifier from a first circuit board; and
   comparing the first identifier to a predetermined second identifier of a second circuit board to check compatibility between the first circuit board and the second circuit board in the computer;
   wherein said predetermined second identifier is stored prior to said sending.

8. The method of claim 7, wherein the first identifier identifies at least one of a type of the first circuit board and a version of the type of the first circuit board.

9. The method of claim 7, wherein the comparing step includes:
   comparing the first identifier to a registry of identifications of circuit boards.

10. The method of claim 7, further comprising:
    responsive to the step of comparing, preventing the first circuit board from fully powering up if an incompatibility is found.

11. The method of claim 7, wherein the first identifier is sent serially from the first circuit board.

12. The method of claim 11, wherein the comparing includes comparing the first identifier one bit at a time.

13. A method of checking compatibility between first and second circuit boards inserted into a midplane, comprising:
    inserting into the midplane a first circuit board having a first memory holding a first identification;
    inserting into the midplane a second circuit board having a second memory holding a second identification; and
    comparing the first identification with the second identification to check compatibility between the first circuit board and the second circuit board.

14. The method of claim 13, further comprising:
if the first circuit board and the second circuit board are compatible, allowing at least one of the first circuit board and the second circuit board to fully power up; and
if the first circuit board and the second circuit board are incompatible, preventing one of the first circuit board and the second circuit board from fully powering up.

15. The method of claim 13, wherein checking compatibility includes checking a version of at least one of the first circuit board and the second circuit board.

16. The method of claim 13, wherein the first circuit board and the second circuit board are positioned on opposite sides of the midplane.

17. The method of claim 13, wherein the first circuit board and the second circuit board are positioned on a same side of the midplane.

18. The method of claim 13, further comprising:
communicating at least one of the first identification and the second identification serially from at least one of the first circuit board and the second circuit board.

19. The method of claim 18, wherein the comparing includes comparing the first identifier to the second identifier one bit at a time.

20. A circuit board, comprising:
a memory storing a predetermined identification of the circuit board,
a connector configured to receive a separate identification from a separate circuit board; and
circuitry coupled to the memory and the connector, wherein the circuitry compares the identification of the circuit board with the separate identification of the separate circuit board to check for compatibility between the circuit board and the separate circuit board.

21. The circuit board of claim 20, wherein at least one of the circuit board and the separate circuit board is prevented from fully powering up if the comparison of the identification with the separate identification indicates that the circuit board and the separate circuit board are incompatible.

22. The circuit board of claim 20, wherein at least one of the identification and the separate identification is communicated serially from at least one of the circuit board and the separate circuit board.

23. The circuit board of claim 22, wherein the circuitry compares the identification to the separate identification one bit at a time.

24. A computer system, comprising:
a midplane;
a first circuit board coupled to the midplane, including a first memory holding a first predetermined identification; and
a second circuit board coupled to the midplane, including a second memory holding a second predetermined identification;
wherein the first identification is compared with the second identification to check compatibility of the first circuit board with the second circuit board.

25. The computer system of claim 24, wherein at least one of the first circuit board and the second circuit board is prevented from fully powering up if the first identification and the second identification identify the first circuit board and the second circuit board as incompatible.

26. The computer system of claim 24, wherein at least one of the first identification and the second identification is communicated serially from at least one of the first circuit board and the second circuit board.

27. The computer system of claim 26, wherein the circuitry compares the first identification to the second identification one bit at a time.

28. A computer system, comprising:
a midplane;
a first circuit board configured for coupling to the midplane and comprising:
a read-only memory containing a first identifier of the first circuit board; and
a conductor for communicating the first identifier to the midplane;
a second circuit board configured for coupling to the midplane and comprising:
a read-only memory containing a second identifier of the second circuit board;
a conductor for receiving the first identifier;
logic for comparing the first identifier to the second identifier to determine whether the first circuit board and the second circuit board are compatible; and
an early power line configured to power said logic before the second circuit board is fully powered;
wherein the second circuit board is prevented from being fully powered if the first circuit board and the second circuit board are determined to be incompatible.

29. The computer system of claim 24, further comprising:
a registry of circuit board identifiers, wherein said registry is coupled to the midplane.

30. The computer system of claim 28, wherein the identifier of the first circuit board is carried serially through said conductors of the first circuit board and the second circuit board.

* * * * *